United States Patent
Yang et al.

(10) Patent No.: US 10,168,369 B2
(45) Date of Patent: Jan. 1, 2019

(54) DEVICE AND METHOD OF TESTING DUAL-FREQUENCY NONLINEAR VECTOR NETWORK PARAMETERS

(71) Applicant: THE 41ST INSTITUTE OF CHINA ELECTRONICS TECHNOLOGY GROUP CORPORATION, Qingdao (CN)

(72) Inventors: Baoguo Yang, Qingdao (CN); Fushun Nian, Qingdao (CN); Shengli Liang, Qingdao (CN); Shubiao Li, Qingdao (CN); Zunfeng Wang, Qingdao (CN); Zhiying Cao, Qingdao (CN); Qinglong Zhang, Qingdao (CN); Mingmin Li, Qingdao (CN)

(73) Assignee: THE 41ST INSTITUTE OF CHINA ELECTRONICS TECHNOLOGY GROUP CORPORATION, Qingdao (CN)

( * ) Notice: Subject to any disclaimer, the term of this patent is extended or adjusted under 35 U.S.C. 154(b) by 0 days.

(21) Appl. No.: 15/752,692

(22) PCT Filed: Sep. 6, 2016

(86) PCT No.: PCT/CN2016/098149
§ 371 (c)(1),
(2) Date: Feb. 14, 2018

(87) PCT Pub. No.: WO2017/041686
PCT Pub. Date: Mar. 16, 2017

(65) Prior Publication Data
US 2018/0238946 A1 Aug. 23, 2018

(30) Foreign Application Priority Data
Sep. 11, 2015 (CN) .......................... 2015 1 0577865

(51) Int. Cl.
*G01R 27/32* (2006.01)
*G01R 31/00* (2006.01)
(Continued)

(52) U.S. Cl.
CPC .............. *G01R 27/32* (2013.01); *G01R 23/16* (2013.01); *G01R 31/00* (2013.01); *G01R 35/005* (2013.01)

(58) Field of Classification Search
CPC ........ G01R 27/32; G01R 23/16; G01R 23/20; G01R 31/00; G01R 35/005
(Continued)

(56) References Cited

U.S. PATENT DOCUMENTS 6,211,663 B1 * 4/2001 Moulthrop ......... G01R 31/2822
324/615
6,529,844 B1 3/2003 Kapetanic et al.
(Continued)

FOREIGN PATENT DOCUMENTS

CN 102571483 A 7/2012
CN 203798915 U 8/2014
(Continued)

OTHER PUBLICATIONS

International Search Report (PCT/ISA/210) dated Nov. 16, 2016, by the State Intellectual Property Office of China as the International Searching Authority for International Application No. PCT/CN2016/098149.
(Continued)

*Primary Examiner* — John H Le
(74) *Attorney, Agent, or Firm* — Buchanan Ingersoll & Rooney PC

(57) ABSTRACT

A device and method of testing the dual-frequency nonlinear vector network parameters. In view of the challenge of the nonlinear behavioral model characterization of the micro-
(Continued)

wave device components, and the current situation of the nonlinear vector network parameter testing, the disclosed device and method of testing the dual-frequency nonlinear vector network parameters redefines the nonlinear model parameters of the nonlinear device components, gives the definition of the test parameter (W-parameter), solves the challenges of the dual-frequency nonlinear behavioral model characterization and testing for the microwave device components, and makes it more convenient to measure the nonlinear characteristics of the mixer, amplifier and passive device components.

1 Claim, 2 Drawing Sheets

(51) Int. Cl.
    *G01R 23/16*     (2006.01)
    *G01R 35/00*     (2006.01)

(58) Field of Classification Search
    USPC ........ 702/57, 76, 85; 324/601, 613; 370/252
    See application file for complete search history.

(56) References Cited

U.S. PATENT DOCUMENTS

| | | | |
|---|---|---|---|
| 7,248,866 B1 * | 7/2007 | Tsironis | G01R 27/32 |
| | | | 324/642 |
| 2009/0216468 A1 | 8/2009 | Anderson | |
| 2013/0234741 A1 * | 9/2013 | Mow | H01Q 1/243 |
| | | | 324/750.01 |
| 2015/0071097 A1 | 3/2015 | Entsfellner et al. | |

FOREIGN PATENT DOCUMENTS

| | | |
|---|---|---|
| CN | 104202085 A | 12/2014 |
| CN | 104204840 A | 12/2014 |
| CN | 105242132 A | 1/2016 |

OTHER PUBLICATIONS

Written Opinion (PCT/ISA/237) dated Nov. 16, 2016, by the State Intellectual Property Office of China as the International Searching Authority for International Application No. PCT/CN2016/098149.

* cited by examiner

DEVICE AND METHOD OF TESTING DUAL-FREQUENCY NONLINEAR VECTOR NETWORK PARAMETERS

TECHNICAL FIELD

The present invention relates to the field of testing the dual-frequency nonlinear vector network parameters, in particular to a device and method of testing the dual-frequency nonlinear vector network parameters.

BACKGROUND

With the continuous development of modern microwave millimeter wave communication systems, for example, the rapid development of the mobile communication system, phased array radar, satellite communication, satellite navigation, electronic countermeasures and precision guidance systems and equipment, the high-speed broadband technology has become a development trend. This new technology often requires the communication system possess multi-carrier and large-dynamic-range characteristics, so the linearity of the microwave devices is very demanding. Therefore, for a microwave device component such as a wide-bandgap semiconductor, ultra-wideband mixer and high-power low intermodulation connector, their nonlinear characterization and modeling problem has attracted much attention of the industry. The general way to study this problem is to test their nonlinear behavioral characteristics based on the black-box theory.

The existing approach to testing the nonlinear characteristics of microwave device components is to model their behavioral-level nonlinear characteristics by regarding the microwave device components as a "network" under test with N ports, where the concept of the network is derived from the "black box model." The famous nonlinear models include the X-parameter Model and the Cardiff Model. The X-parameter Model was developed by Dr. Jan, mainly launched by Keysight Technologies (formerly known as Agilent Technologies Inc.) and modeled and processed by the ADS software; the Cardiff Model was established by Mesuro Limited in the United Kingdom and is mainly launched by R&S (Rohde & Schwarz) at present. However, these models are based on single-frequency signal excitation, and thus cannot fully express the nonlinear behavioral characteristics of the device components or the behavioral parameters of the device components such as passive component intermodulation distortion, power amplifier intermodulation distortion, mixer frequency conversion loss and divider frequency division loss. Therefore, in the field of microwave communications, there is an urgent need for a model and testing method that breaks through the limitation of single-frequency excitation, predicts the nonlinear behaviors of the microwave device components and may be used for system design.

SUMMARY OF THE INVENTION

In view of the above-mentioned technical problems, this application discloses a device and method of testing the dual-frequency nonlinear vector network parameters, which is reasonable in design, overcomes the shortcomings mentioned above and solves the challenges of dual-frequency nonlinear behavioral characterization and testing of the microwave device components with good results.

In order to achieve the purpose above, the following technical solution is disclosed:

A device of testing the dual-frequency nonlinear vector network parameters, comprising a frequency reference module, selector switches, testing ports, multiplier selection units, receivers, couplers, a mixer, a computer module and loads; wherein, The selector switches comprises a first selector switch, a second selector switch, a third selector switch, a fourth selector switch, a fifth selector switch, a sixth selector switch and a seventh selector switch;

The testing ports comprise a first testing port, a second testing port and a third testing port;

The multiplier selection units comprise a first multiplier selection unit and a second multiplier selection unit for realizing the selection of the pass-through, double, triple . . . n-tuple for the signals;

The receivers comprise a R receiver for providing a phase reference for the nonlinear testing, an R1 receiver for testing the output signal of the first signal source, an R2 receiver for testing the output signal of the second signal source, an A receiver for testing the signal entering the first testing port, a B receiver for testing the signal entering the second testing port, and a C receiver for testing the signal entering the third testing port;

The receiver mainly comprises a frequency mixing module, an intermediate frequency conditioning module, an A/D conversion module and a DSP vector calculation module;

The couplers comprise a first coupler, a second coupler, a third coupler, a fourth coupler and a fifth coupler;

The first coupler sends the coupled portion of the signal emitted from a first signal source to the R1 receiver;

The second coupler sends the coupled portion of the signal emitted from a second signal source to the R2 receiver;

The third coupler sends the coupled portion of the incoming signal from a first testing port to the A receiver;

The fourth coupler sends the coupled portion of the incoming signal from a second testing port to the B receiver;

The fifth coupler sends the coupled portion of the incoming signal from a third testing port to the C receiver;

The mixer is configured to frequency mix the output signal of the first multiplier selection unit and the output signal of the second multiplier selection unit and output the signal subject to frequency mixing to the R receiver via the fifth selector switch;

The loads comprise a first load and a second load;

The frequency reference module generates two signal sources, that is, a first signal source and a second signal source, and a local oscillator signal source for sending a local oscillator signal to a receiver; the first signal source and the second signal source input the signal to the first testing port or the third testing port in an independent or combined fashion, the second signal source outputs the signal to the second testing port independently, the local oscillator signal source sends the local oscillator signal to six receivers, namely, R receiver, R1 receiver, R2 receiver, A receiver, B receiver and C receiver;

The signals from the first signal source and the second signal source are respectively divided into the first multiplier selection unit and the second multiplier selection unit, and the signal output from the first multiplier selection unit is sent to the R receiver via the sixth selector switch and the fifth selector switch; or the signal output from the second multiplier selection unit is sent to the R receiver via the seventh selector switch and the fifth selector switch; or the signal output from the first multiplier selection unit and the signal output from the second multiplier selection unit enter the mixer where the frequency mixing is performed via the sixth selector switch and the seventh selector switch respectively, and the signal that is frequency mixed by the mixer is sent to the R receiver via the fifth selector switch;

The signal in the R receiver and the signals that respectively enter the R1 receiver, R2 receiver, A receiver, B receiver and C receiver via the first coupler, the second coupler, the third coupler, the fourth coupler and the fifth coupler are frequency mixed with the local oscillator signal generated by the local oscillator signal source to output an intermediate frequency signal which is subjected to intermediate frequency conditioning by an intermediate frequency conditioning module, then enters an A/D conversion module for sampling and conversion and then enters the DSP vector calculation module where the digital intermediate frequency signal is subjected to I/O decomposition and filtering, and the received signal is tested for its amplitude and phase and the test data is sent to the computer module for nonlinear modeling; additionally, the computer module controls the sweep frequency and power of the first signal source and the second signal source as well as the local oscillator signal source;

In addition, the disclosure here also involves a method of testing the dual-frequency nonlinear vector network parameters, which adopts a device of testing the dual-frequency nonlinear vector network parameters as mentioned above and comprises the following steps:

Step 1: For the two-port network under test, connect the device under test (DUT) to the first testing port and the third testing port;

Step 2: For testing the single-frequency reflection response and single-frequency transmission response, turn off the second signal source, let the first selector switch gate on the first testing port, let the third selector switch gate on the first signal source and let the fourth selector switch gate on the first load; the test signal generated by the first signal source is loaded by the first testing port to the device under test and the signal transmitted to the third testing port is absorbed by the first load; after calibration, test the forward full frequency band S-parameter of the two-port network and test the single-frequency reflection response and single-frequency transmission response using the test results of the R1 receiver, A receiver and C receiver;

Step 3: For testing the single-frequency backward reflection response and single-frequency backward transmission response, turn off the first signal source, let the second selector switch gate on the third testing port, let the third selector switch gate on the second load, let the fourth selector switch gate on the second signal source; the test signal generated by the second signal source is loaded by the third testing port to the device under test and the signal transmitted to the first testing port is absorbed by the second load; after calibration, test the backward full frequency band S-parameter of the two-port network and test the single-frequency backward reflection response and single-frequency backward transmission response using the test results of the R2 receiver, A receiver and C receiver;

Step 4: For testing the forward harmonic response, let the first selector switch gate on the first testing port, let the second selector switch gate on the third testing port, let the third selector switch gate on the first signal source, let the fourth selector switch gate on the first load, let the sixth selector switch gate on the R receiver, let the fifth selector switch gate on the first signal source, let the first multiplier selection unit select N-tuple, where N is a positive integer greater than 2, after calibration, test the N-times harmonic response and test the forward harmonic response using the test results of the R receiver, R1 receiver, A receiver and C receiver;

Step 5: For testing the backward harmonic response, let the first selector switch gate on the first testing port, let the second selector switch gate on the third testing port, let the third selector switch gate on the first signal source, let the fourth selector switch gate on the first load, let the sixth selector switch gate on the R receiver, let the fifth selector switch gate on the first signal source, let the second multiplier selection unit select N-tuple, where N is a positive integer greater than 2, after calibration, test the N-times harmonic response, and test the backward harmonic response using the test results of the R receiver, R1 receiver, A receiver and C receiver;

Step 6: Repeat the on-off actions in Steps 4 and 5, test the impact of the harmonic frequency on the fundamental frequency, and test the response of the 1/N frequency component of the excitation frequency;

Step 7: For testing the intercoupling effect of the dual-tone signals, assume that the frequency difference between two signals is $\Delta=\omega_2-\omega_1$ and test the intercoupling effect of the dual-tone signals;

Step 8: For testing the forward excitation response, let the first selector switch gate on the first testing port, let the second selector switch gate on the first testing port, the output of which is a dual-tone signal, and test the forward excitation response using the data from the R1 receiver, R2 receiver, A receiver, B receiver and C receiver;

Step 9: For testing the backward excitation response, let the first selector switch gate on the third testing port, let the second selector switch gate on the third testing port, the output of which is a dual-tone signal, and test the backward excitation response using the data from the R1 receiver, R2 receiver, A receiver, B receiver and C receiver;

Step 10: For testing the forward response and backward response of the dual-tone signal sum frequency, let the first selector switch gate on the first testing port, let the second selector switch gate on the first testing port, the output of which is a dual-tone signal, let the first multiplier selection unit select pass-through, let the second multiplier selection unit select pass-through, let the sixth selector switch and the seventh selector switch select frequency mixing, let the fifth selector switch select the mixed frequency output, let the receiving frequency of the R receiver be $\omega_1+\omega_2$, test the forward response of the dual-tone signal sum frequency using the data from the R receiver, R1 receiver, B receiver and C receiver, and similarly test the backward response of the dual-tone signal sum frequency when the third testing port outputs a dual-tone signal;

Step 11: For testing the forward response and backward response of the dual-tone signal beat frequency, let the first selector switch gate on the first testing port, let the second selector switch gate on the first testing port, the output of which is a dual-tone signal, let the first multiplier selection unit select pass-through, let the second multiplier selection unit select pass-through, let the sixth selector switch and the seventh selector switch select frequency mixing, let the fifth selector switch select the mixed frequency output, let the receiving frequency of the R receiver be $\omega_2-\omega_1$, test the forward response of the dual-tone signal beat frequency using the data of the R receiver, R1 receiver, B receiver and C receiver, and similarly test the backward response of the dual-tone signal beat frequency when the third testing port outputs a dual-tone signal;

Step 12: For testing the forward third-order intermodulation and backward third-order intermodulation of the dual-tone signal sum frequency, let the first selector switch gate on the first testing port, let the second selector switch gate on the first testing port, the output of which is a dual-tone signal, let the first multiplier unit select pass-through, let the second multiplier selection unit select pass-through, let the sixth selector switch and the seventh selector switch select frequency mixing, let the fifth selector select mixed frequency output, let the receiving frequency of the R receiver be $2\omega_1+\omega_2$ or $\omega_1+2\omega_2$, test the forward third-order intermodulation of the dual-tone signal sum frequency using the data from the R receiver, R1 receiver, B receiver and C receiver, and similarly test the backward third-order intermodulation of the dual-tone signal sum frequency when the third testing port outputs a dual-tone signal;

Step 13: For testing the forward third-order intermodulation and backward third-order intermodulation of the dual-tone signal beat frequency, let the first selector switch gate on the first testing port, let the second selector switch gate on the first testing port, the output of which is a dual-tone signal, let the first multiplier unit select pass-through, let the second multiplier selection unit select pass-through, let the sixth selector switch and the seventh selector switch select frequency mixing, let the fifth selector select mixed frequency output and let the receiving frequency of the R receiver be $2\omega_1-\omega_2$ or $2\omega_2-\omega_1$, test the forward third-order intermodulation of the dual-tone signal beat frequency using the data from the R receiver, R1 receiver, B receiver and C receiver and similarly test the backward third-order intermodulation of the dual-tone signal beat frequency when the third testing port outputs a dual-tone signal;

Step 14: Express the test results using the dual-frequency nonlinear microwave W scattering function matrix, $[b]=[W][a]$, $W_{i,j}=W_{(i,k)}^{(m_b,n_b)-(m_a,m_a)}$, where, i and j represent the positions of the W matrix, k represents the port number of the input a-wave, l represents the port number of the output b-wave, m and n represent the dual-tone orders and both are integers and don't assume 0 simultaneously, $(m_a,n_a)$ represents the frequency of the a-wave at a frequency of $m_a\omega_1+n_a\omega_2$ and $(m_b,n_b)-(m_a,n_a)$ represents the response of the b-wave to the a-wave at a frequency of $m_b\omega_1+n_b\omega_2$.

The beneficial technical effects brought by the disclosed device and method are as follows:

In view of the challenges of the nonlinear behavioral model characterization and testing of the microwave device components and the current situation of the nonlinear vector network parameter testing, this application describes a device and method of testing the dual-frequency nonlinear vector network parameters, redefines the nonlinear model parameter indicators of the nonlinear device components, gives the definition of the test parameter, that is, the definition of W-parameter, solves the challenges of the dual-frequency nonlinear behavioral model characterization and testing for the microwave device components, makes it more convenient to measure the nonlinear characteristics of the mixer, amplifier and passive device components and has a good promotional value.

SPECIFIC EMBODIMENTS

Figure 1:
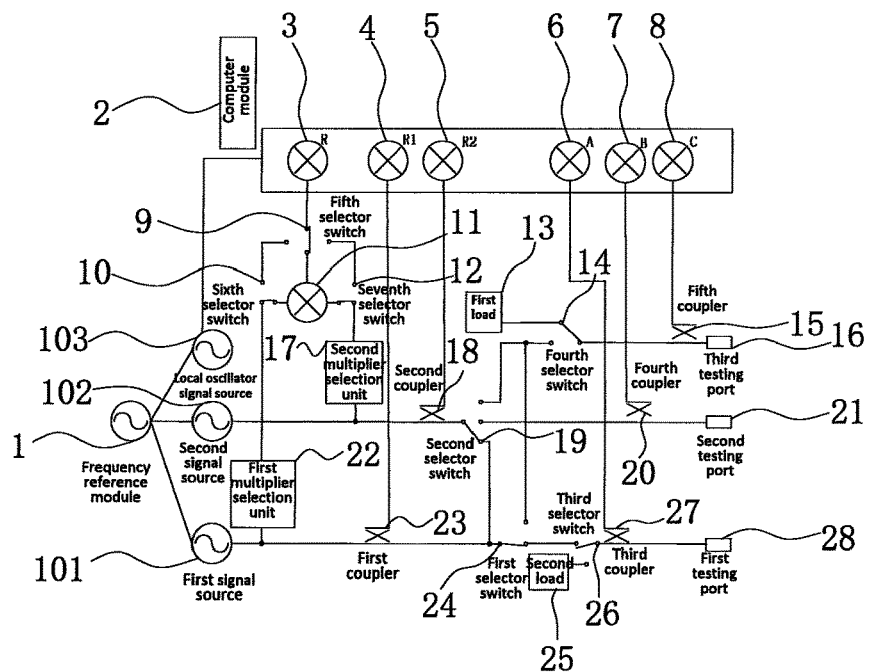
FIG. 1 illustrates a schematic diagram for the hardware for an embodiment of a device for testing the dual-frequency nonlinear vector network parameters.

The disclosed device and method will be further described in detail below with reference to the drawings and specific embodiments. The reference numerals in the drawings reflect the following components: 1—frequency reference module; 101—first signal source; 102—second signal source; 103—local oscillator signal source; 2—computer module; 3—R receiver; 4—R1 receiver; 5—R2 receiver; 6—A receiver; 7—B receiver; 8—C receiver; 9—fifth selector switch; 10—sixth selector switch; 11 mixer; 12—seventh selector switch; 13—first load; 14—fourth selector switch; 15—fifth coupler; 16—third testing port; 17—second multiplier selection unit; 18—second coupler; 19—second selector switch; 20—fourth coupler; 21—second testing port; 22—first multiplier selection unit; 23—first coupler; 24—first selector switch; 25—second load; 26—third selector switch; 27—third coupler; 28—first testing port.

Embodiment 1

As shown in FIG. 1, a device of testing the dual-frequency nonlinear vector network parameters comprises a frequency reference module 1, selector switches, testing ports, multiplier selection units, receivers, couplers, a mixer 11, a computer module 2 and loads.

The selector switches comprise a first selector switch 24, a second selector switch 19, a third selector switch 26, a fourth selector switch 14, a fifth selector switch 9, a sixth selector switch 10 and a seventh selector switch 12.

The multiplier selection units comprise a first multiplier selection unit 22 and a second multiplier selection unit 17 for realizing the selection of the pass-through, double, triple . . . . n-tuple for the signals.

The receivers comprise an R receiver 3 for providing a phase reference for the nonlinear testing, an R1 receiver 4 for testing the output signal of the first signal source 101, an R2 receiver 5 for testing the output signal of the second signal source 101, an A receiver 6 for testing the signal entering the first testing port 28, a B receiver 7 for testing the signal entering the second testing port 21, and a C receiver 8 for testing the signal entering the third testing port 16.

The receiver mainly comprises a frequency mixing module, an intermediate frequency conditioning module, an A/D conversion module and a DSP vector calculation module.

The couplers comprise a first coupler 23, a second coupler 18, a third coupler 27, a fourth coupler 20, and a fifth coupler 15.

The first coupler 23 sends the coupled portion of the signal emitted from a first signal source 101 to the R1 receiver 4.

The second coupler 18 sends the coupled portion of the signal emitted from a second signal source 102 to the R2 receiver 5.

The third coupler 27 sends the coupled portion of the incoming signal from a first testing port 28 to the A receiver 6.

The fourth coupler 20 sends the coupled portion of the incoming signal from a second testing port 21 to the B receiver 7.

The fifth coupler 15 sends the coupled portion of the incoming signal from a third testing port 16 to the C receiver 8.

The mixer 11 is configured to frequency mix the output signal of the first multiplier selection unit 22 and the output signal of the second multiplier selection unit 17 and output the signal subject to frequency mixing to the R receiver 3 via the fifth selector switch 9.

The loads comprise a first load 13 and a second load 25.

The frequency reference module 1 generates two signal sources, that is, a first signal source 101 and a second signal source 102, and a local oscillator signal source 103 for sending a local oscillator signal to a receiver. The first signal source 101 and the second signal source 102 input the signal to the first testing port 28 or the third testing port 16 in an independent or combined fashion, the second signal source 102 outputs the signal to the second testing port 21 independently, and the local oscillator signal source 103 sends the local oscillator signal to six receivers, namely, R receiver 3, R1 receiver 4, R2 receiver 5, A receiver 6, B receiver 7 and C receiver 8.

The signals from the first signal source 101 and the second signal source 102 are respectively divided into the first multiplier selection unit 22 and the second multiplier selection unit 17. The signal output from the first multiplier selection unit 22 is sent to the R receiver 3 via the sixth selector switch 10 and the fifth selector switch 9; or the signal output from the second multiplier selection unit 17 is sent to the R receiver 3 via the seventh selector switch 12 and the fifth selector switch 9; or the signal output from the first multiplier selection unit 22 and the signal output from the second multiplier selection unit 17 enter the mixer 11 where the frequency mixing is performed via the sixth selector switch 10 and the seventh selector switch 12 respectively, and the signal that is frequency mixed by the mixer 11 is sent to the R receiver 3 via the fifth selector switch 9.

The first coupler 23 sends the coupled part of the signal emitted from the first testing port 28 to the R1 receiver 4. The second coupler 18 sends the coupled part of the signal emitted from the second testing port 21 to the signal R2 receiver 5. The third coupler 27 sends the coupled part of the incoming signal from the first testing port 28 to the A receiver 6. The fourth coupler 20 sends the coupled part of the incoming signal from the second testing port 21 to the B receiver 7. The fifth coupler 15 sends the coupled part of the incoming signal from the third testing port 16 to the C receiver 8.

The signal entering the R receiver 3 and the signals that enter the R1 receiver 4, R2 receiver 5, A receiver 6, B receiver 7 and C receiver 8 are respectively frequency mixed with the local oscillator signal generated by the local oscillator signal source 103 to output an intermediate frequency signal which is subjected to intermediate frequency conditioning by an intermediate frequency conditioning module, then enters an A/D conversion module for sampling and conversion and then enters the DSP vector calculation module where the digital intermediate frequency signal is subjected to I/Q decomposition and filtering, and the received signal is tested for its amplitude and phase. The resulting test data is sent to the computer module 2 for nonlinear modeling. Additionally, the computer module 2 controls the sweep frequency and power of the first signal source 101 and the second signal source 102 as well as the local oscillator signal source 103.

Embodiment 2

Based on the above-mentioned embodiments, the present disclosure also involves a method of testing the dual-frequency nonlinear vector network parameters that solves the challenges of the dual-frequency nonlinear behavioral characterization and testing of the microwave device components.

Figure 2:
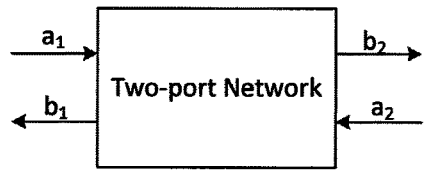
FIG. 2 illustrates a schematic diagram for the black box model in a device and method of testing the dual-frequency nonlinear vector network parameters.

(1) The working principle is as follows:

As shown in FIG. 2, the microwave nonlinear system is described by the nonlinear two-port network (that is, DUT) of the black box theory, where, a1 represents the incoming signal of Port 1, b1 represents the reflected signal of Port 1, a2 represents the incoming signal of Port 2 and b2 represents the outgoing signal of Port 2. When the excitation signal is a single-frequency signal, they are single-frequency microwave signals and the linear S-parameter is defined as:

$$S_{11} = \frac{b_1}{a_1}\bigg|_{a_2=0}, S_{21} = \frac{b_2}{a_1}\bigg|_{a_2=0}, S_{12} = \frac{b_1}{a_2}\bigg|_{a_1=0}, S_{22} = \frac{b_2}{a_2}\bigg|_{a_1=0}$$

Figure 3:
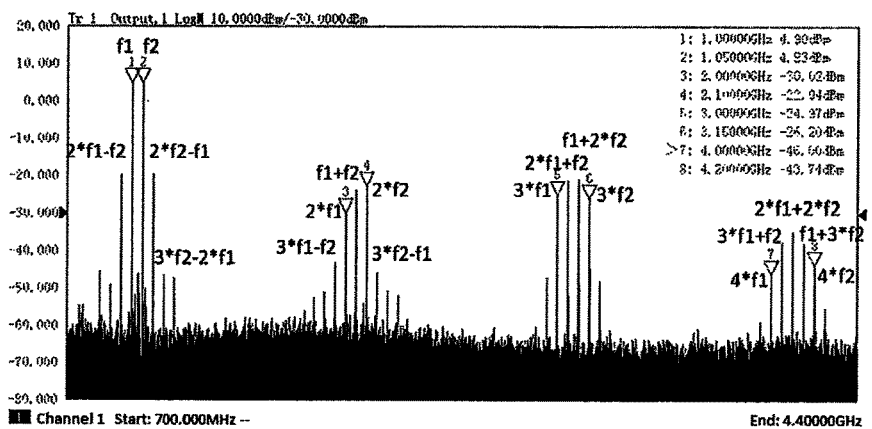
FIG. 3 illustrates an output response diagram for the dual-frequency signal excitation amplifier module.

When the excitation signal is a dual-tone signal, the nonlinear network output signal will produce a series of combined frequency components which are intermodulation interference in addition to the fundamental, harmonic analysis and DC components. The typical output spectrum of the excitation amplifier module for a set of dual-frequency signals is as shown in FIG. 3. It is noteworthy that the intermodulation interference close to the fundamental component is not filtered by the filter in the communication system.

Assume that the network under test is a constant network without considering the amplifier memory effect. Suppose that the nonlinear network input a(t) as shown in FIG. 1 is a dual-frequency signal, a(t)=A1(t)+A2(t), then the output wave b(t) will have scattering and intermodulation components, the output can be expressed as b=f(a). f is a nonlinear function and also a complex function. It is derived from the complex function theory that:

$$\frac{\partial F(a)}{\partial a} = \frac{\partial \text{Re}(F(a))}{\partial \text{Re}(a)} + j\frac{\partial \text{Im}(F(a))}{\partial \text{Re}(a)} = \frac{\partial \text{Im}(F(a))}{\partial \text{Im}(a)} - j\frac{\partial \text{Re}(F(a))}{\partial \text{Im}(a)}$$

$$\text{Let: } J_{RR} = \frac{\partial \text{Re}(F(a))}{\partial \text{Re}(a)}, J_{IR} = \frac{\partial \text{Im}(F(a))}{\partial \text{Re}(a)},$$

$$J_{II} = \frac{\partial \text{Im}(F(a))}{\partial \text{Im}(a)}, J_{RI} = \frac{\partial \text{Re}(F(a))}{\partial \text{Im}(a)}.$$

Then use the complex equality algorithm, and write the matrix form to get:

$$\begin{bmatrix} \text{Re}(b) \\ \text{Im}(b) \end{bmatrix} = \begin{bmatrix} J_{RR} & J_{RI} \\ J_{IR} & J_{II} \end{bmatrix} \begin{bmatrix} \text{Re}(a) \\ \text{Im}(a) \end{bmatrix}$$

In the actual nonlinear circuits, if the excitation source is single-frequency excitation, the response function is composed of a series of harmonic frequencies of the excitation frequency, that is, the response function may be expressed as an array, $[b]=[b^1, =b^2, \ldots, b^m, \ldots]$, where the superscript, m, represents the harmonic number. Let us consider that the excitation function is excited by a series of harmonic frequencies of the excitation frequency, $[a]=[a^1, a^2, \ldots, a^m, \ldots]$ may also be expressed as an array, then the matrix form above may be written in the form of real partitioned matrix $$\begin{bmatrix} \text{Re}([b]) \\ \text{Im}([b]) \end{bmatrix} = \begin{bmatrix} [J_{RR}] & [J_{RI}] \\ [J_{IR}] & [J_{II}] \end{bmatrix} \begin{bmatrix} \text{Re}([a]) \\ \text{Im}([a]) \end{bmatrix}$$

The complex form can be written directly, and because of its similarity to the S-parameter concept, the nonlinear scattering function S-matrix is defined.

$$[b]=[S][a]$$

It is a nonlinear large-signal expression, which is similar to the expression of small signal S-parameter, and can be converted into the small-signal S-para meter.

Under dual-frequency excitation, the signal is complicated in composition and includes the intermodulation component in addition to the fundamental component and harmonic component. The intermodulation frequencies of all the sums and differences produced by two frequencies are defined as $IM(\omega_1,\omega_2)=|m\omega_1\pm n\omega_2|$, where, both m and n are positive integers and m+n is an order.

Here we further unify the intermodulation frequency, fundamental component and harmonic component, let m and n be integers and both not assume 0 simultaneously, let $f(\omega_1,\omega_2)=[|m\omega_1\pm n\omega_2|]$, then the fundamental component, harmonic component and intermodulation frequency are contained.

Let the dual-frequency excitation signals be a and a', then the two-port nonlinear network input as shown in FIG. 1 is:

$$[a]=[a_1,a_2]=[f(a_1,a'_1),f(a_2,a'_2)]$$

Let the outgoing signal be:

$$[b]=[b_1,b_2]=[f(b_1,b'_1),f(b_2,b'_2)]$$

By replacing the transfer matrix S with the hieroglyphic letter W that represents the intermodulation, the dual-frequency nonlinear microwave W scattering matrix is defined as:

$$[b]=[W][a].$$

(2) The workflow is as follows:

Assume that the system analyzes the second harmonic third-order intermodulation, then:

$$f(\omega_1,\omega_2) = |m\omega_1 \pm n\omega_2| = [\omega_1, 2\omega_1, \omega_2, \omega_1+\omega_2,$$
$$|\omega_1-\omega_2|, 2\omega_1+\omega_2, |2\omega_1-\omega_2|, 2\omega_2, \omega_1+2\omega_2, |\omega_1-2\omega_2|]$$

Therefore, it is a matrix where the W-parameter is 20*20. In the dual-frequency nonlinear scattering parameter W-parameter matrix, each W-parameter factor has its own physical meaning. The positions of the W matrix may be defined as i and j, the port number of the network output b-wave defined as l, the port number of the input a-wave defined as k, the dual-tone orders defined as m and n, both of which are integers and don't assume 0 simultaneously, $(m_a, n_a)$ represents the frequency of the a-wave at a frequency of $m_a\omega_1+n_a\omega_2$ and $(m_b,n_b)-(m_a,n_a)$ represents the response of the b-wave to the a-wave at a frequency of $m_b\omega_1+n_b\omega_2$. Then, the W matrix can be W expressed as $W_{i,j}=W_{(l,k)}^{(m_b,n_b)-(m_a,n_a)}$.

Figure 4:
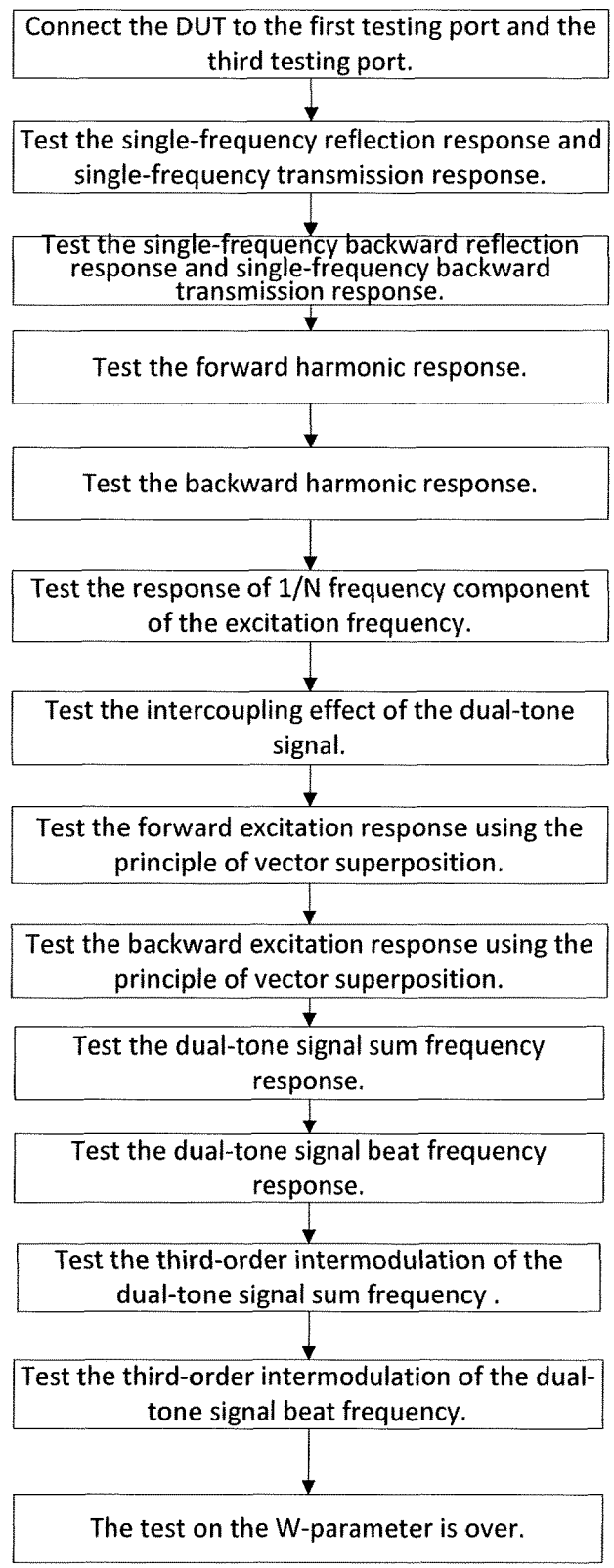
FIG. 4 illustrates a flow block diagram for a method of testing the dual-frequency nonlinear vector network parameters.

(3) The testing comprises the following steps (as shown in FIG. 4):

Step 1: For the two-port network under test, connect the device under test (DUT) to the first testing port and the third testing port;

Step 2: For testing the single-frequency reflection response and single-frequency transmission response, turn off the second signal source, let the first selector switch gate on the first testing port, let the third selector switch gate on the first signal source and let the fourth selector switch gate on the first load; the test signal generated by the first signal source is loaded by the first testing port to the device under test and the signal transmitted to the third testing port is absorbed by the first load; after calibration, test the forward full frequency band S-parameter of the two-port network and test the single-frequency reflection response and single-frequency transmission response using the test results of the R1 receiver, A receiver and C receiver, giving $S_{11}(f)$ and $S_{21}(f)$ which respectively correspond to $W_{(1,1)}^{(m,n)-(m,n)}$ (single-frequency reflection response) and $W_{(2,1)}^{(m,n)-(m,n)}$ (single-frequency transmission response) according to the frequencies; there are totally 20 array elements such as $W_{(1,1)}^{(1,1)-(1,1)}=S_{11}(\omega_1+\omega_2)$;

Step 3: For testing the single-frequency backward reflection response and single-frequency backward transmission response, turn off the first signal source, let the second selector switch gate on the third testing port, let the third selector switch gate on the second load, let the fourth selector switch gate on the second signal source; the test signal generated by the second signal source is loaded by the third testing port to the device under test and the signal transmitted to the first testing port is absorbed by the second load; after calibration, test the backward full frequency band S-parameter of the two-port network and test the single-frequency backward reflection response and single-frequency backward transmission response using the test results of the R2 receiver, A receiver and C receiver, giving $S_{22}(f)$ and $S_{12}(f)$ which respectively correspond to $W_{(2,2)}^{(m,n)-(m,n)}$ (single-frequency reflection response) and (single-frequency transmission response) according to the frequencies; there are totally 20 array elements;

Step 4: For testing the forward harmonic response, let the first selector switch gate on the first testing port, let the second selector switch gate on the third testing port, let the third selector switch gate on the first signal source, let the fourth selector switch gate on the first load, let the sixth selector switch gate on the R receiver, let the fifth selector switch gate on the first signal source, let the first multiplier selection unit select N-tuple, where N is a positive integer greater than 2, after calibration, test the N-times harmonic response and test the forward harmonic response using the test results of the R receiver, R1 receiver, A receiver and C receiver, giving $W_{(1,1)}^{(2,0)-(1,0)}$, $W_{(1,1)}^{(0,2)-(0,1)}$, $W_{(2,1)}^{(2,0)-(1,0)}$ and $W_{(2,1)}^{(0,2)-(0,1)}$; there are totally 4 array elements such as $$W_{(1,1)}^{(2,0)-(1,0)} = \frac{A/R}{R_1/R};$$

Step 5: For testing the backward harmonic response, let the first selector switch gate on the first testing port, let the second selector switch gate on the third testing port, let the third selector switch gate on the first signal source, let the fourth selector switch gate on the first load, let the sixth selector switch gate on the R receiver, let the fifth selector switch gate on the first signal source, let the second multiplier selection unit select N-tuple, where N is a positive integer greater than 2, after calibration, test the N-times harmonic response, and test the backward harmonic response using the test results of the R receiver, R1 receiver, A receiver and C receiver, giving $W_{(1,1)}^{(2,0)-(1,0)}$, $W_{(1,1)}^{(0,2)-(0,1)}$, $W_{(2,1)}^{(2,0)-(1,0)}$ and $W_{(2,1)}^{(0,2)-(0,1)}$; there are totally 4 array elements;

Step 6: Repeat the on-off actions in Steps 4 and 5, test the impact of the harmonic frequency on the fundamental frequency, and test the response of the 1/N frequency component of the excitation frequency, where N=2, getting 4 forward responses and 4 backward responses such as $W_{(1,1)}^{(1,0)-(2,0)}$;

Step 7: For testing the intercoupling effect of the dual-tone signals, assume that the frequency difference between two signals is $\Delta=\omega_2-\omega_1$ and test the intercoupling effect of the dual-tone signals, finding that 120 items such as $W_{(1,1)}^{(1,0)-(1,1)}$ and $W_{(1,1)}^{(2,0)-(0,2)}$ are 0;

Step 8: For testing the forward excitation response, let the first selector switch gate on the first testing port, let the second selector switch gate on the first testing port, let the first testing port gate on the dual-tone signal and test the forward excitation response using the data from the R1 receiver, R2 receiver, A receiver, B receiver and C receiver;

Step 9: For testing the backward excitation response, let the first selector switch gate on the third testing port, let the second selector switch gate on the third testing port, the output of which is a dual-tone signal, and test the backward excitation response using the data from the R1 receiver, R2 receiver, A receiver, B receiver and C receiver, finding 4 items such as $W_{(1,1)}^{(1,0)-(0,1)}$;

Step 10: For testing the forward response and backward response of the dual-tone signal sum frequency, let the first selector switch gate on the first testing port, let the second selector switch gate on the first testing port, the output of which is a dual-tone signal, let the first multiplier selection unit select pass-through, let the second multiplier selection unit select pass-through, let the sixth selector switch and the seventh selector switch select frequency mixing, let the fifth selector switch select the mixed frequency output, let the receiving frequency of the R receiver be $\omega_1+\omega_2$, test the forward response of the dual-tone signal sum frequency using the data from the R receiver, R1 receiver, B receiver and C receiver, finding 4 parameters such as $W_{(1,1)}^{(1,1)-(0,1)}$ and $W_{(2,1)}^{(1,1)-(1,0)}$ and similarly test the backward response of the dual-tone signal sum frequency when the third testing port outputs a dual-tone signal, finding 4 parameters such as $W_{(1,2)}^{(1,1)-(0,1)}$;

Step 11: For testing the forward response and backward response of the dual-tone signal beat frequency, let the first selector switch gate on the first testing port, let the second selector switch gate on the first testing port, the output of which is a dual-tone signal, let the first multiplier selection unit select pass-through, let the second multiplier selection unit select pass-through, let the sixth selector switch and the seventh selector switch select frequency mixing, let the fifth selector switch select the mixed frequency output, let the receiving frequency of the R receiver be $\omega_2-\omega_1$, test the forward response of the dual-tone signal beat frequency using the data of the R receiver, R1 receiver, B receiver and C receiver, finding 4 parameters such as $W_{(1,1)}^{(1,-1)-(0,1)}$ and similarly test the backward response of the dual-tone signal beat frequency when the third testing port outputs a dual-tone signal, finding 4 parameters such as $W_{(1,2)}^{(1,-1)-(0,1)}$;

Step 12: For testing the forward third-order intermodulation and backward third-order intermodulation of the dual-tone signal sum frequency, let the first selector switch gate on the first testing port, let the second selector switch gate on the first testing port, the output of which is a dual-tone signal, let the first multiplier unit select pass-through, let the second multiplier selection unit select pass-through, let the sixth selector switch and the seventh selector switch select frequency mixing, let the fifth selector select mixed frequency output, let the receiving frequency of the R receiver be $2\omega_1+\omega_2$ or $\omega_1+2\omega_2$, test the forward third-order intermodulation of the dual-tone signal sum frequency using the data from the R receiver, R1 receiver, B receiver and C receiver, finding 8 parameters such as $W_{(1,1)}^{(2,1)-(0,1)}$ and similarly test the backward third-order intermodulation of the dual-tone signal sum frequency when the third testing port outputs a dual-tone signal, finding 8 parameters such as $W_{(1,2)}^{(2,1)-(0,1)}$;

Step 13: For testing the forward third-order intermodulation and backward third-order intermodulation of the dual-tone signal beat frequency, let the first selector switch gate on the first testing port, let the second selector switch gate on the first testing port, the output of which is a dual-tone signal, let the first multiplier unit select pass-through, let the second multiplier selection unit select pass-through, let the sixth selector switch and the seventh selector switch select frequency mixing, let the fifth selector select mixed frequency output and let the receiving frequency of the R receiver be $2\omega_1-\omega_2$ or $2\omega_2-\omega_1$, test the forward third-order intermodulation of the dual-tone signal beat frequency using the data from the R receiver, R1 receiver, B receiver and C receiver, finding 8 parameters such as $W_{(1,1)}^{(2,-1)-(0,1)}$ and similarly test the backward third-order intermodulation of the dual-tone signal beat frequency when the third testing port outputs a dual-tone signal, finding 8 parameters such as $W_{(1,2)}^{(2,-1)-(0,1)}$;

Step 14: According to the principle of master signal, let other items be 0. There are totally 168 array elements. Express the test results using the dual-frequency nonlinear microwave W scattering function matrix, $[b]=[W][a]$, $W_{i,j}=W_{(l,k)}^{(m_b,n_b)-(m_a,n_a)}$, where, i and j represent the positions of the W matrix, k represents the port number of the input a-wave, l represents the port number of the output b-wave, m and n represent the dual-tone orders and both are integers and don't assume 0 simultaneously, $(m_a,n_a)$ represents the frequency of the a-wave at a frequency of $m_a\omega_1+n_a\omega_2$ and $(m_b,n_b)-(m_a,n_a)$ represents the response of the b-wave to the a-wave at a frequency of $m_b\omega_1+n_b\omega_2$.

In view of the challenges of the nonlinear behavioral model characterization and testing of the microwave device components and the current situation of the nonlinear vector network parameter testing, the disclosure here involves a device and method of testing the dual-frequency nonlinear vector network parameters, redefines the nonlinear model parameter indicators of the nonlinear device components, gives the definition of the test parameter (that is, the definition of W-parameter), solves the challenges of the dual-frequency nonlinear behavioral model characterization and testing for the microwave device components, makes it more convenient to measure the nonlinear characteristics of the mixer, amplifier and passive device components and has a good promotional value.

Of course, the description above is not intended to limit the present invention. The present invention is not limited to the above-mentioned examples, and any variations, modifications, additions, or replacements made by those persons skilled in the art within the spirit of the present invention belong to the protection scope of the present invention.

What is claimed is:

1. A device of for testing dual-frequency nonlinear vector network parameters, the device comprising:
   a frequency reference module configured to generate two signal sources and a local oscillator signal source for sending a local oscillator signal to a receiver, the two signal sources being a first signal source and a second signal source;
   selector switches comprising a first selector switch, a second selector switch, a third selector switch, a fourth selector switch, a fifth selector switch, a sixth selector switch and a seventh selector switch;

testing ports comprising a first testing port, a second testing port and a third testing port;

multiplier selection units comprising a first multiplier selection unit and a second multiplier selection unit for realizing selection of pass-through, double, triple . . . n-tuple for the signals;

receivers comprising an R receiver for providing a phase reference for the nonlinear testing, an R1 receiver for testing an output signal of the first signal source, an R2 receiver for testing the output signal of the second signal source, an A receiver for testing the signal entering the first testing, port, a B receiver for testing the signal entering the second testing port, and a C receiver for testing the signal entering the third testing port;

couplers comprising a first coupler, a second coupler, a third coupler, a fourth coupler and a fifth coupler;

a mixer configured to frequency mix an output signal of the first multiplier selection unit and the output signal of the second multiplier selection unit and output the signal subject to frequency mixing to the R receiver via the fifth selector switch;

a computer module; and loads comprising a first load and a second load, wherein each of the receivers comprises a frequency mixing module, an intermediate frequency conditioning module, an A/D conversion module and a DSP vector calculation module;

the first coupler sends a coupled portion of the signal emitted from the first signal source to the R1 receiver;

the second coupler sends the coupled portion of the signal emitted from the second signal source to the R2 receiver;

the third coupler sends the coupled portion of the incoming signal from the first testing port to the A receiver;

the fourth coupler sends the coupled portion of the incoming signal from the second testing, port to the B receiver;

the fifth coupler sends the coupled portion of the incoming signal from the third testing port to the C receiver;

the first signal source and the second signal source input the signal to the first testing port or the third testing port in an independent or combined fashion, the second signal source outputs the signal to the second testing port independently, the local oscillator signal source sends the local oscillator signal to the R receiver, the R1 receiver, the R2 receiver, the A receiver, the B receiver and the C receiver;

the signals from the first signal source and the second signal source are respectively divided into the first multiplier selection unit and the second multiplier selection unit, and the signal output from the first multiplier selection unit is sent to the R receiver via the sixth selector switch and the fifth selector switch, or the signal output from the second multiplier selection unit is sent to the R receiver via the seventh selector switch and the fifth selector switch, or the signal output from the first multiplier selection unit and the signal output from the second multiplier selection unit enter the mixer where the frequency mixing is performed via the sixth selector switch and the seventh selector switch respectively, and the signal that is frequency mixed by the mixer is sent to the R receiver via the fifth selector switch;

the signal in the R receiver and the signals that respectively enter the R1 receiver, R2 receiver, A receiver, B receiver and C receiver via the first coupler, the second coupler, the third coupler, the fourth coupler and the fifth coupler are frequency mixed with the local oscillator signal generated h the local oscillator signal source to output an intermediate frequency signal which is subjected to intermediate frequency conditioning by an intermediate frequency conditioning module, then enters the A/D conversion module for sampling and conversion and then enters the DSP vector calculation module where the digital intermediate frequency signal is subjected to I/Q decomposition and filtering, and the received signal is tested for amplitude and phase to obtain test data, and the test data being sent to the computer module for nonlinear modeling; and the computer module controls a sweep frequency and a power of the first signal source, the second signal source, and the local oscillator signal source.

* * * * *